(12) United States Patent
Cheng et al.

(10) Patent No.: US 6,607,118 B2
(45) Date of Patent: Aug. 19, 2003

(54) APPARATUS AND METHOD FOR BALL RELEASE

(75) Inventors: Chi Wah Cheng, Kwai Chung (HK); Ping Kong Joseph Choy, Kwai Chung (HK); Ping Chun Benson Chong, Kwai Chung (HK); Ka Kin Wong, Kwai Chung (HK); Chi Fung Chan, Kwai Chung (HK)

(73) Assignee: ASM Assembly Automation Limited, Kwai Chung (HK)

( * ) Notice: Subject to any disclaimer, the term of this patent is extended or adjusted under 35 U.S.C. 154(b) by 66 days.

(21) Appl. No.: 09/843,704

(22) Filed: Apr. 30, 2001

(65) Prior Publication Data

US 2002/0158108 A1 Oct. 31, 2002

(51) Int. Cl.[7] .................................................. B23K 1/06
(52) U.S. Cl. .................................................... 228/110.1
(58) Field of Search .............................. 228/110.1, 102, 228/212; 29/430, 743, 559, 843

(56) References Cited

U.S. PATENT DOCUMENTS

| | | |
|---|---|---|
| 5,284,287 A | 2/1994 | Wilson et al. |
| 5,467,913 A | 11/1995 | Namekawa et al. |
| 5,601,229 A | 2/1997 | Nakazato et al. |
| 5,657,528 A | 8/1997 | Sakemi et al. |
| 5,750,199 A | 5/1998 | Sakemi |
| 5,768,775 A | 6/1998 | Nakazato |
| 5,839,191 A | 11/1998 | Economy et al. |
| 6,003,753 A | 12/1999 | Hwang et al. |
| 6,065,201 A | * 5/2000 | Sakai .......................... 228/245 |
| 6,099,681 A | 8/2000 | Arikado et al. |
| 6,158,649 A | 12/2000 | Miura |
| 6,170,737 B1 | 1/2001 | Foulke et al. |

* cited by examiner

*Primary Examiner*—Tom Dunn
*Assistant Examiner*—Jonathan Johnson
(74) *Attorney, Agent, or Firm*—Burns, Doane, Swecker & Mathis, LLP

(57) ABSTRACT

There is disclosed a method and apparatus for ensuring release of objects such as solder balls from a pick head in a transfer and placement apparatus, comprising causing said pick head to vibrate by applying a vibration signal to said pick head over a range of frequencies. The range of frequencies is chosen such that it bounds the resonant frequencies of the pick head which may be calculated by computer simulation.

7 Claims, 5 Drawing Sheets

APPARATUS AND METHOD FOR BALL RELEASE

FIELD OF THE INVENTION

This invention relates to an apparatus and method for enhancing the release of conductive balls, eg solder balls, from a ball pick head in a ball transfer and placement apparatus. More generally the invention could also be applied to the release of any form of small object from a pick head or the like.

BACKGROUND OF THE INVENTION

It is conventional to transfer and place on a ball grid array (BGA) substrate a plurality of solder balls simultaneously. This is done using a ball pick head which may comprise an array of openings matching the desired pattern of solder balls to be placed on corresponding solder pads of the BGA substrate. The openings are connected to a source of suction to hold the solder balls in place in the openings during the transfer process. The balls may then be released in a desired pattern on solder pads on the BGA. An example of such a conventional technique is described in the Assignee's co-pending application Ser. No. 09/352,368. As shown in FIG. 1, a plurality of solder balls 1 are supplied to a ball template 4 in which they are arranged in a desired pattern before being lifted from the template 4 by a ball pick head 3 and moved along path A to a BGA substrate 7 where they are to be released. During the pick and transfer stages, the solder balls 1 are held to the pick head by suction, when the balls are to be released onto the substrate 7, this suction is removed to allow the balls 1 to be released from the pick head.

More generally, FIG. 2 illustrates two problems with conventional techniques. The left side of FIG. 2 illustrates the problem of excess balls adhering to the pick head when a pick head is lowered into a supply of solder balls that have not been pre-arranged in a desired pattern in the manner of FIG. 1. The second problem is illustrated in the right of FIG. 2. When the balls are to be released, they may not always be completely released as will be explained in the following.

Conventional techniques encounter difficulties with very small BGA packages such as chip scale/size packages (CSP) which are becoming increasingly popular with their use in small handheld electronic devices such as handheld computers, PDAs and mobile telephones. A CSP is a form of BGA with a substantially reduced form factor, and so the size of the solder balls is correspondingly reduced. Solder balls of a diameter of around 0.2–0.3 mm are conventional in CSP technology.

Unfortunately the size of such very small solder balls starts to introduce difficulties into the successful release of the solder balls from the ball pick head for a number of reasons. These include: (1) inevitable contamination by very small foreign objects on the surface of the balls or the lower surface of the pick head introducing an adhesive force such as surface tension between the balls and the lower surface of the pick head; and (2) electrostatic charges between the balls and between the balls and the pick head. While such phenomena may also be present in larger size balls and BGAs, they present more serious problems in CSP devices because the weight of the balls is much smaller and thus the gravitational force acting to release the balls from the pick head is correspondingly smaller. In this regard it will be appreciated that the weight of a ball decreases proportionately faster than the diameter of the balls. Because of these issues, reliable release of the solder balls from the pick head in the case of a very small BGA such as a CSP is difficult to achieve.

PRIOR ART

A number of attempts have been made in the prior art to overcome this problem and to enhance the release of very small solder balls from a ball pick head. A number of examples of such prior art and the approaches that have been taken will now be described.

One approach is described in U.S. Pat. No. 5,467,913 and is to apply a positive air/gas pressure to the inside of the ball pick head such as to help push or "blow" the balls away from the pick head on release. However, in practice only a small number of balls will stick to the head and the remainder will be released normally. This means that when the positive air pressure is applied it is wasted by being discharged through the openings from which the majority of the balls have already been released and it will have little or no effect on the small number of balls that are still adhered to the pick head.

Another approach is to move the pick head with the balls attached so that the balls contact the solder pads before they are released. Examples of this concept can be seen in U.S. Pat. No. 5,768,775, U.S. Pat. No. 6,099,681 and U.S. Pat. No. 6,158,649. The idea is that there will then be adhesive forces between the solder pads and the balls that will be greater than any forces tending to hold the balls to the pick head, and thus that these adhesive forces will assist in release of the balls from the pick head. However, in many cases it is difficult, if not impossible, to arrange for the solder balls on the pick head to be exactly co-planar and so when the pick head is moved to bring the balls into contact with the solder pads, some balls will contact the pads first and all forces will be concentrated through these balls with large stresses being exerted on them. This has the effect of increasing the adhesion of these balls to the pick head making it even harder to release them.

U.S. Pat. No. 6,170,737 describes an apparatus in which an array of pins is added within the pick head that act to push through the openings to release the solder balls from the pick head. This method works well for normally sized BGA designs, but with small-scale CSP devices it implies very difficult manufacturing processes and high cost.

Finally, further approaches to the problem include providing mechanical vibration either to the whole pick head or to the suction plate. U.S. Pat. No. 5,657,528 is an example of the latter. The suction template (in which is provided the suction openings holding the solder balls) is attached to the remainder of the pick head through vibration isolating members and a vibrating member is provided on the suction template to provide vibrations while the balls are being released. The drawback with this, however, is that the vibration pattern will depend on the pattern of suction holes which will vary between different semiconductor devices. This results in different vibration patterns with different BGA designs, and which different patterns may have quite different efficiencies at assisting release of the balls from the pick head. There will also inevitably be nodal points where there is minimum or even zero amplitude of vibration, and if any of these points exist at or near an opening with a solder ball, there may be insufficient vibration to secure the release of the ball.

A related approach is to apply a vibration to the entire pick head and not just to the suction template. However, this requires a relatively large vibration amplitude to be applied to the pick head which not only requires large vibration actuators but may also damage the pick head. Furthermore the vibration needs to be applied for a significant duration (a few seconds) which makes this method not very efficient.

SUMMARY OF THE INVENTION

According to the present invention there is provided a method for ensuring release of objects from a pick head in a transfer and placement apparatus, comprising causing said pick head to vibrate by applying a vibration signal to said pick head over a range of frequencies.

Preferably the vibration is applied by generating a random signal over said range of frequencies to a vibration means secured to said pick head, and the range of frequencies may be chosen to bound the principal resonant frequencies of said pick head. In this embodiment the resonant frequencies may be already known, or may be calculated by computer simulation. Frequencies above and below said range may be excluded by means of low and high pass filters.

According to another broad aspect of the present invention there is provided a method for ensuring release of solder balls from a ball pick head in a ball transfer and placement apparatus, comprising causing said pick head to vibrate by applying a vibration signal to said pick head over a range of frequencies.

According to a still further broad aspect of the present invention there is provided a method for ensuring release of objects from a pick head in a transfer and placement apparatus, comprising the steps of:

(a) analysing said pick head to identify the resonant frequencies of said pick head, (b) selecting first and second frequencies defining a range of frequencies that include said resonant frequencies, and (c) applying vibrations to said pick head over said range of frequencies.

Viewed from a further aspect the invention also provides apparatus for ensuring release of objects from a pick head in a transfer and placement apparatus, comprising: signal generating means for generating a random signal between first and second frequencies, vibration generating means for causing vibration of said pick head, said vibration generating means receiving said random signal as an input signal.

BRIEF DESCRIPTION OF THE DRAWINGS

An embodiment of the invention will now be described by way of example and with reference to the accompanying drawings, in which.

DETAILED DESCRIPTION OF PREFERRED EMBODIMENTS

Figure 6:
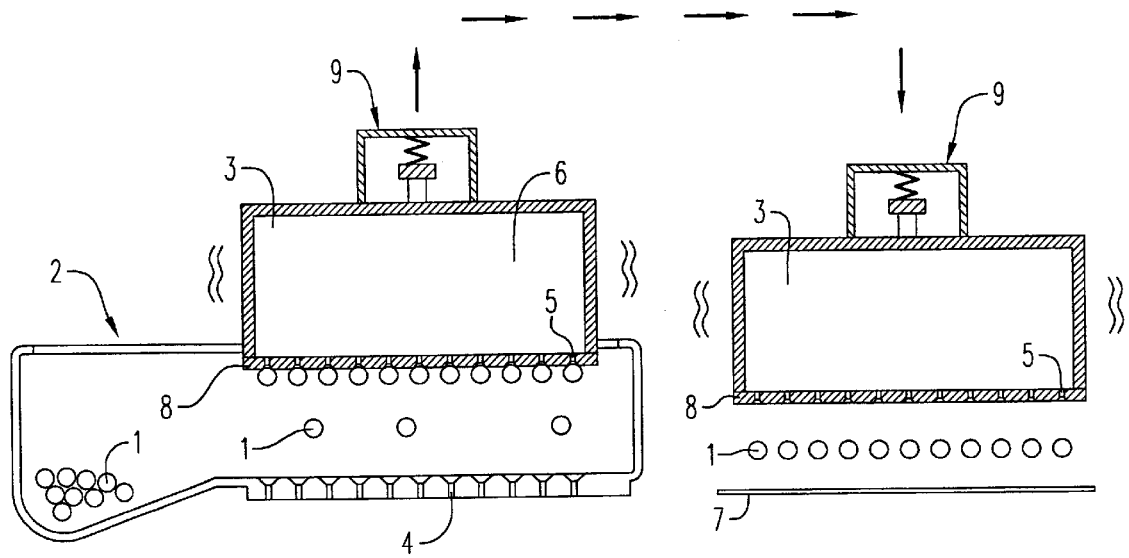
FIG. 6 illustrates a ball pick and release sequence in accordance with an embodiment of the present invention.

Referring firstly to FIG. 6 there is shown the ball transfer sequence according to a first embodiment of the invention.

A plurality of solder balls 1 are supplied to a ball supply means 2 in which the balls 1 are located in a desired pattern and configuration. This may be achieved, for example, by the method described in Ser. No. 09/352,368, which is incorporated herein by reference.

A ball pick head 3 comprises a pick head template 8 having a plurality of openings 5 for receiving balls 1 from the ball supply means 2. A vacuum chamber 6 is formed behind the template 8 so that the openings 5 may be connected to vacuum in order to enable the ball pick head 3 to pick balls 1 from the template. Attached to the ball pick head 3 is a vibration means 9 for causing the pick head 3 to vibrate in a manner that will be described in more detail below. In use the ball pick head 3 is lowered over the ball supply means 2 in order to collect balls 1, and is then raised away from the ball supply means 2 for subsequent transfer to further processing steps. While the pick head 3 is being raised, vibrations may be applied to the ball pick head 3 in a manner to be described below to cause excess solder balls 1 to fall away from the ball pick head 3. At this stage the balls 1 are otherwise held in place on the suction template 8 by the applied suction.

The ball pick head 3 then transfers the balls 1 to a position above a BGA substrate 7. The ball pick head 3 is located above the substrate such that the individual solder balls are located directly above their corresponding solder pads. At this stage the suction holding the balls 1 to the template 8 is removed such that the balls may be released from the template by gravity onto the solder pads. As discussed above, however, especially for very small solder balls used in CSP technology, it is possible that not all the solder balls may be released properly. It should be noted that if just a single solder ball is not released onto the corresponding solder pad it may result in an improperly formed electrical connection and an entire BGA may be faulty and may have to be discarded.

To ensure complete and reliable release of the solder balls onto the solder pads, in addition to removing the application of suction, vibration is applied to the ball pick head by the vibration means in the manner to be described below.

Figure 1:
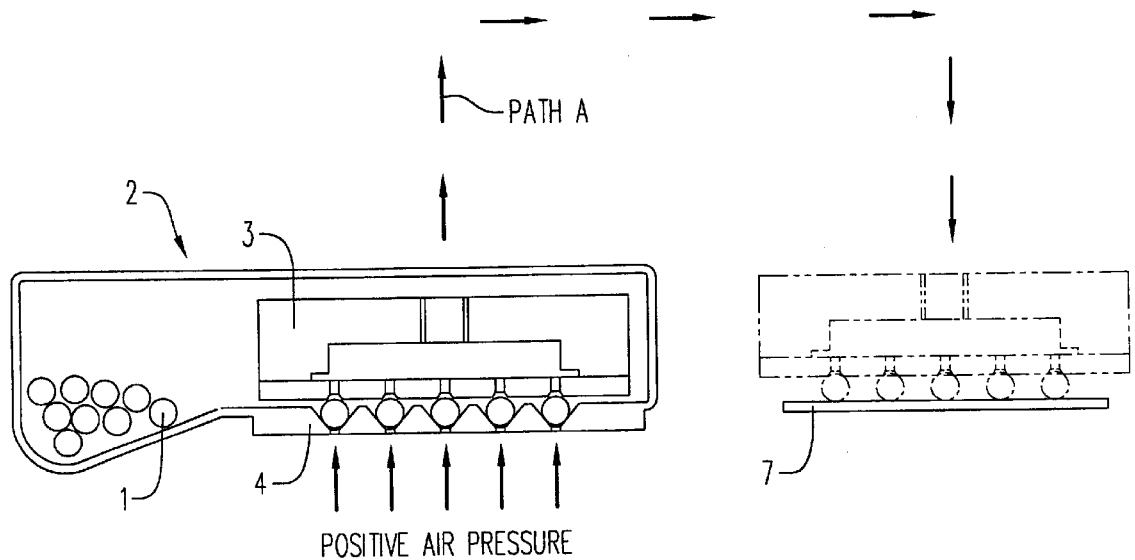
FIG. 1 is a view illustrating a known ball transfer method and apparatus.
Figure 2:
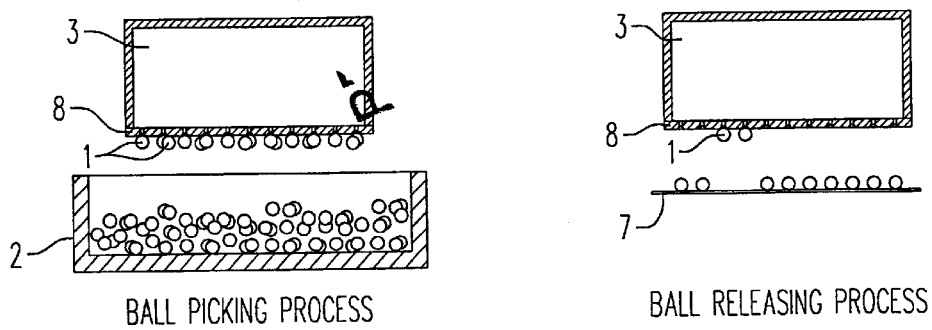
FIG. 2 illustrates a known ball pick and release sequence with incomplete ball release.
Figure 3:
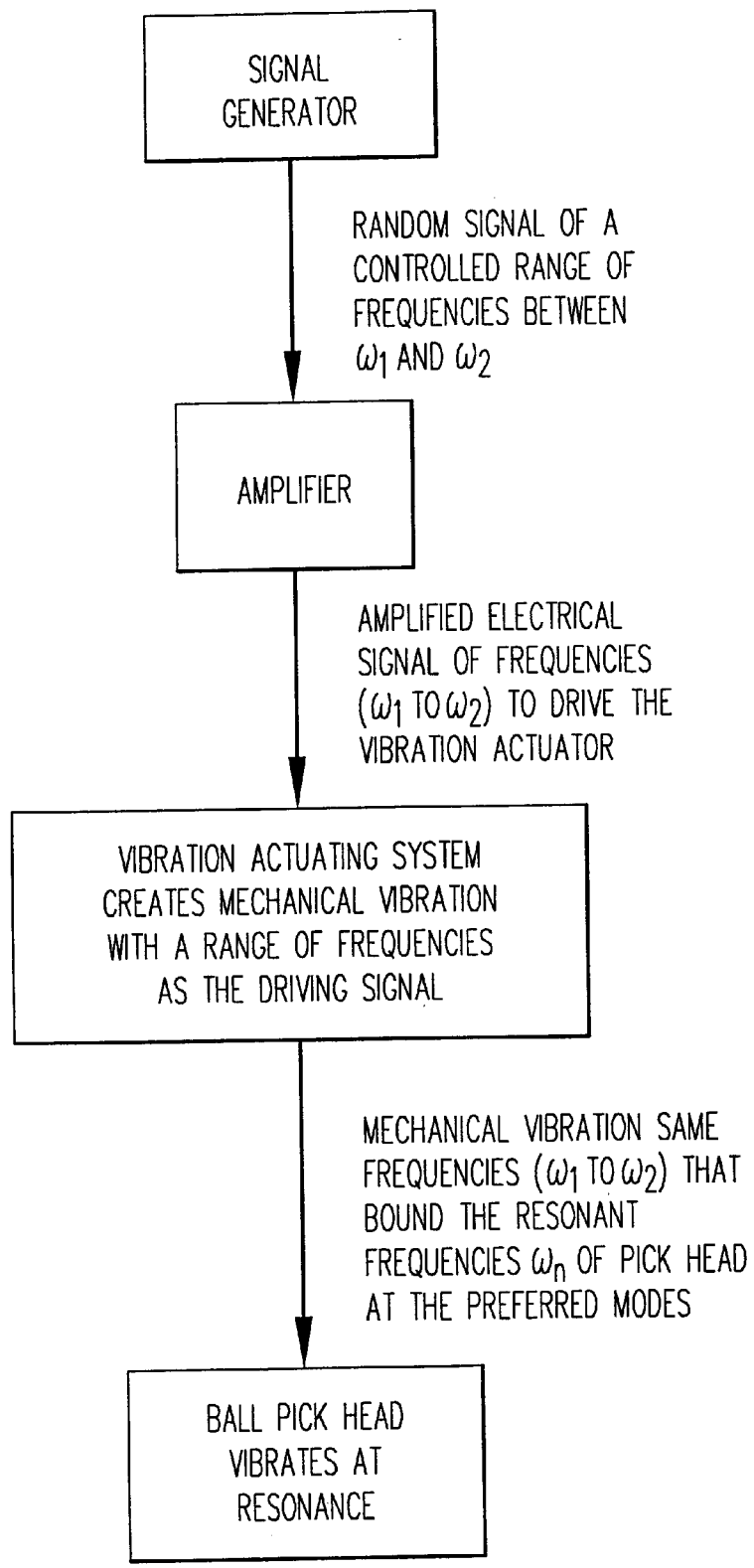
FIG. 3 is a block diagram illustrating the method of the present invention.

FIG. 3 is a block diagram showing how the vibration is applied to the ball pick head in this embodiment of the invention. A signal generator is used to generate a random signal (for example either a Pseudo Random Binary Signal (PRBS) or a swept sine signal) of a controlled range between lower and upper frequencies $\omega_1$ and $\omega_2$ which are then amplified by an amplifier and used to drive the vibration means to create a mechanical vibration of the pick head. An important aspect of the present invention is that instead of driving the vibration at a single frequency, the vibration is driven over a range of frequencies, and that furthermore the lower and upper limits of the frequency range are chosen so that they bound the resonant frequencies $\omega_n$ of the pick head. This concept is illustrated in particular with reference to FIGS. 7 and 8.

Figure 4:
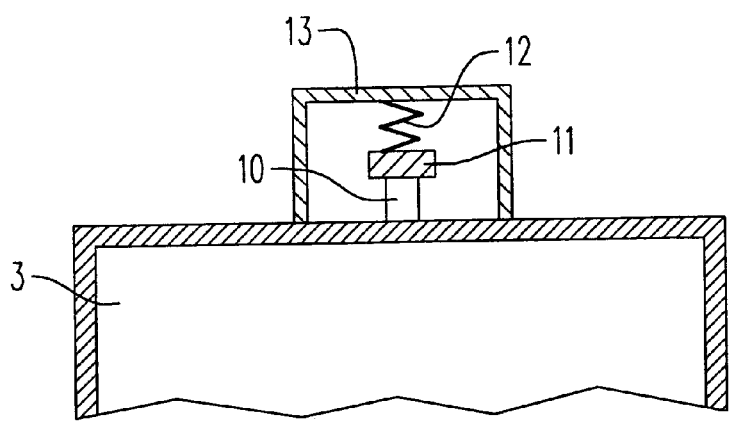
FIG. 4 shows a vibration actuator for use in the present invention.
Figure 5:
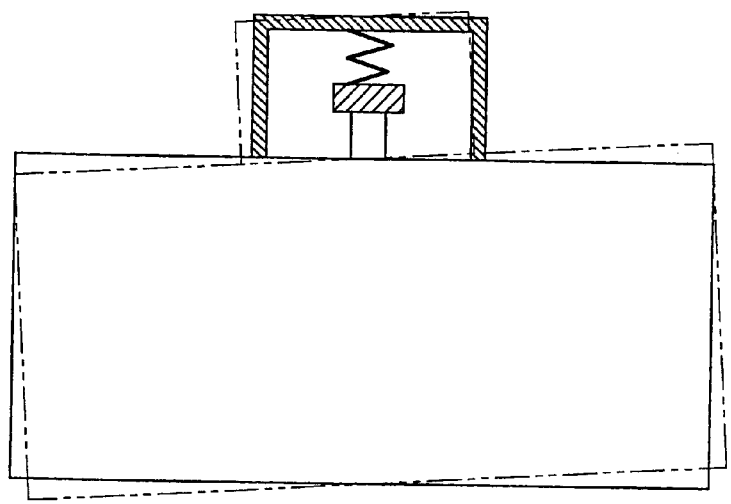
FIG. 5 illustrates a typical vibration mode.
Figure 7:
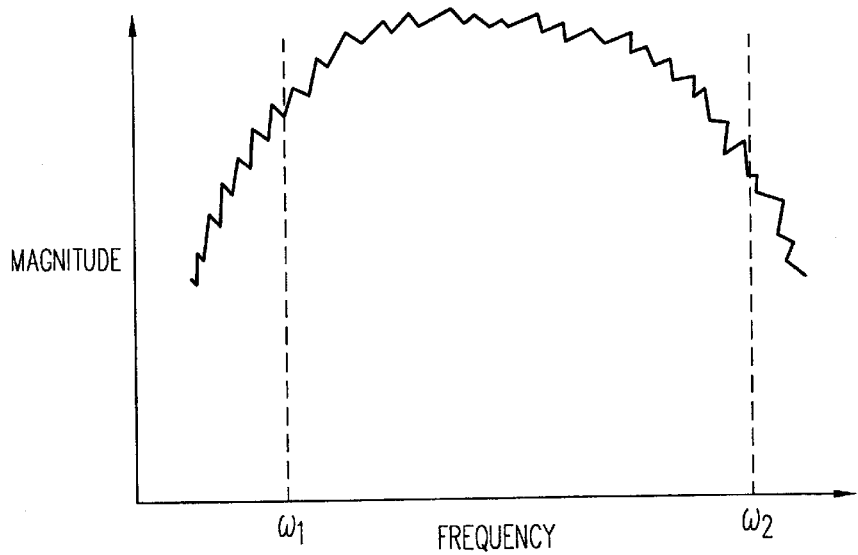
FIG. 7 illustrates a typical frequency spectrum of the applied vibrations.
Figure 8:
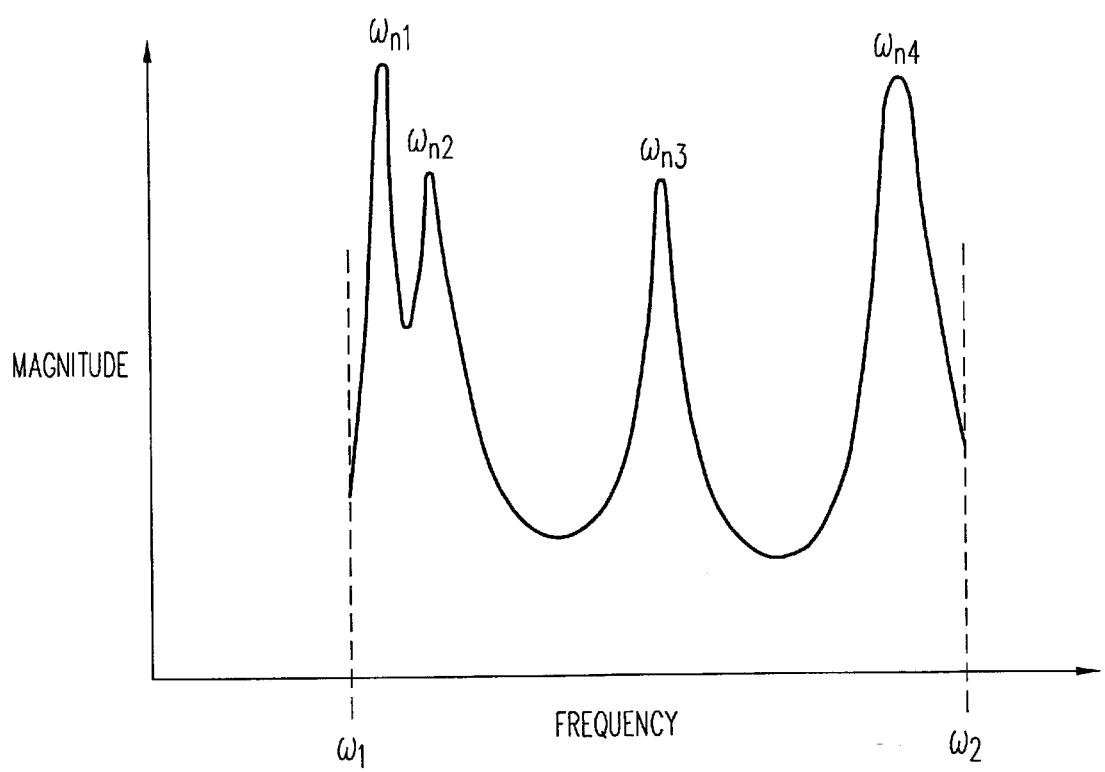
FIG. 8 is a modal analysis of the frequency spectrum applied to the ball pick head.

As shown in FIG. 8, a ball pick head may be analyzed to identify its resonant vibration modes $\omega_n$. This analysis may be performed by any conventional method, for example modal analysis by computer simulation using a finite element software package (eg Ansys). Such a simulation will show the vibration modes as shown in FIG. 8 and this can be used to identify the lower and upper frequencies $\omega_1$ and $\omega_2$. As shown in FIG. 7, a random signal is then generated over this range, with frequencies below $\omega_1$ and above $\omega_2$ being excluded by a band-pass filter. In a typical example, this frequency range may be of the order of a few hundred Hz to a few kHz, though it will be understood that the actual range will depend on the design of an individual ball pick head. The vibration means itself may comprise a miniature mechanical actuator 10 as shown in FIG. 4. The actuator 10 may be a piezoelectric actuator that is brought into close contact with the upper surface of the ball pick head by a force exerted on the actuator through a countermass 11 and a spring 12. The amplified random signal is applied as an input voltage to the piezoelectric actuator, and this in turn will generate vibration modes of the ball pick head as shown in FIG. 5. The combination of actuator, mass and spring maximises the vibration energy in comparison with an actuator alone, and this may be more effective in terms of size and cost. The amplifier may be used to adjust the signal level amplitude until it is sufficiently high to create vibrations of sufficient amplitude to ensure release of all the balls. The vibration means may be located within a housing 13.

Applying vibrations with a range of frequencies, rather than a single frequency as known in the prior art, allows a greater tolerance in variations of the characteristics of the vibration system, including the signal generator, amplifier, vibration means, as well as the ball pick head itself. This means that the ball release is enhanced and vibrating at the "correct" frequency is less critical. Furthermore because the whole ball pick head is caused to vibrate, and not merely the template, any change in the pattern of suction holes will not significantly change the resonant frequencies of the ball pick head as a whole. In any event, even if the resonant frequencies do change slightly, this is less critical because of the fact that a range of frequencies is applied. Moreover, the problem of common nodal points on the template is avoided.

What is claimed is:

1. A method for ensuring release of objects from a pick head in a transfer and placement apparatus, comprising causing said pick head to vibrate by generating a random signal over a range of frequencies and applying said random signal to a vibration means secured to said pick head.

2. A method as claimed in claim 1 wherein said range of frequencies is chosen to bound the principal resonant frequencies of said pick head.

3. A method as claimed in claim 2 wherein said resonant frequencies are calculated by computer simulation.

4. A method as claimed in claim 2 wherein frequencies above and below said range are excluded by means of low and high pass filters.

5. A method for ensuring release of solder balls from a ball pick head in a ball transfer and placement apparatus, comprising causing said pick head to vibrate by applying a random vibration signal to said pick head over a range of frequencies.

6. A method for ensuring release of objects from a pick head in a transfer and placement apparatus, comprising the steps of:

(d) analysing said pick head to identify the resonant frequencies of said pick head, (e) selecting first and second frequencies defining a range of frequencies that include said resonant frequencies, and (f) applying random vibrations to said pick head over said range of frequencies.

7. Apparatus for ensuring release of objects from a pick head in a transfer and placement apparatus, comprising: signal generating means for generating a random signal between first and second frequencies, vibration generating means for causing vibration of said pick head, said vibration generating means receiving said random signal as an input signal.

* * * * *